(12) United States Patent
Adderly et al.

(10) Patent No.: US 9,508,578 B2
(45) Date of Patent: Nov. 29, 2016

(54) METHOD AND APPARATUS FOR DETECTING FOREIGN MATERIAL ON A CHUCK

(71) Applicant: GLOBALFOUNDRIES INC., Grand Cayman (KY)

(72) Inventors: Shawn A. Adderly, Essex Junction, VT (US); Samantha D. DiStefano, Burlington, VT (US); Jeffrey P. Gambino, Westford, VT (US); Max G. Levy, Essex Junction, VT (US); Max L. Lifson, S. Burlington, VT (US); Jed H. Rankin, Richmond, VT (US); Timothy D. Sullivan, Underhill, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 355 days.

(21) Appl. No.: 14/171,874

(22) Filed: Feb. 4, 2014

(65) Prior Publication Data
US 2015/0219479 A1 Aug. 6, 2015

(51) Int. Cl.
*H01L 21/67* (2006.01)
*H01L 21/00* (2006.01)
*G01F 1/76* (2006.01)

(52) U.S. Cl.
CPC ......... *H01L 21/67288* (2013.01); *H01L 21/00* (2013.01); *H01L 21/67109* (2013.01); *G01F 1/76* (2013.01)

(58) Field of Classification Search
CPC ............. H01L 21/67288; H01L 21/00; H01L 21/67109; H01L 21/67253; G06F 1/76
See application file for complete search history.

(56) References Cited

U.S. PATENT DOCUMENTS

| 4,423,967 A | 1/1984 | Mouton |
| 5,609,720 A * | 3/1997 | Lenz ................ H01L 21/67103 156/345.53 |

(Continued)

FOREIGN PATENT DOCUMENTS

KR 20080006734 A * 1/2008

*Primary Examiner* — Francis Gray
(74) *Attorney, Agent, or Firm* — Thompson Hine LLP; Anthony Canale (57) ABSTRACT

An apparatus and method for leak detection of coolant gas from a chuck. The apparatus includes a chuck having a top surface and configured to clamp a substrate to the top surface, the chuck having one or more recessed regions in the top surface, the recessed regions configured to allow a cooling gas to contact a backside of the substrate; a cooling gas inlet and a cooling gas outlet connected to the one or more recessed regions; a first measurement device connected to the cooling gas inlet and configured to measure a first amount of cooling gas entering the cooling gas inlet and a second measurement device connected to the cooling gas outlet and configured to measure a second amount of cooling gas exiting from the cooling gas outlet; and a controller configured to determine a difference between the first amount of cooling gas and the second amount of cooling gas.

18 Claims, 6 Drawing Sheets

(56) References Cited

U.S. PATENT DOCUMENTS

| | | |
|---|---|---|
| 5,886,865 A | 3/1999 | Parkhe et al. |
| 5,939,618 A * | 8/1999 | Hu .................... C01B 13/10 204/176 |
| 5,992,046 A | 11/1999 | Weigand et al. |
| 6,254,398 B1 | 7/2001 | Chen |
| 6,401,359 B1 | 6/2002 | Amano |
| 7,558,045 B1 | 7/2009 | Onate et al. |
| 7,651,263 B2 | 1/2010 | Zolock et al. |
| 2003/0168439 A1 * | 9/2003 | Kanno ................ H01L 21/6831 219/390 |
| 2006/0171095 A1 | 8/2006 | Park et al. |
| 2011/0065276 A1 * | 3/2011 | Ganguly ............. H01L 21/0223 438/694 |
| 2011/0085299 A1 * | 4/2011 | Mizunaga ......... H01L 21/68735 361/692 |
| 2012/0091097 A1 * | 4/2012 | Chen ................ H01J 37/32926 216/59 |
| 2012/0252141 A1 * | 10/2012 | Sundararajan .... H01J 37/32082 438/5 |

\* cited by examiner

METHOD AND APPARATUS FOR DETECTING FOREIGN MATERIAL ON A CHUCK

BACKGROUND

The present invention relates to the field of semiconductor wafer processing systems; more specifically, it relates to a method and apparatus for detecting foreign material on wafer chucks used in semiconductor processing.

Foreign material on chucks can lead to defective wafers. If the foreign material is not immediately detected, many defective wafers can be produced before the problem can be corrected. Accordingly, there exists a need in the art to mitigate the deficiencies and limitations described hereinabove.

BRIEF SUMMARY

A first aspect of the present invention is an apparatus, comprising: a chuck having a top surface and configured to clamp a substrate to the top surface, the chuck having one or more recessed regions in the top surface, the recessed regions configured to allow a cooling gas to contact a backside of the substrate; a cooling gas inlet and a cooling gas outlet connected to the one or more recessed regions; a first measurement device connected to the cooling gas inlet and configured to measure a first amount of cooling gas entering the cooling gas inlet and second measurement device connected to the cooling gas outlet and configured to measure a second amount of cooling gas exiting from the cooling gas outlet; and a controller configured to determine a difference between the first amount of cooling gas and the second amount of cooling gas.

A second aspect of the present invention is a method, comprising: providing a chuck having a top surface and configured to clamp a substrate to the top surface, the chuck having one or more recessed regions in the top surface, the recessed regions configured to allow a cooling gas to contact a backside of the substrate, the chuck including a cooling gas inlet and a cooling gas outlet connected to the one or more recessed regions; supplying cooling gas to the cooling gas inlet and exhausting the cooling gas from the cooling gas outlet; measuring a first amount of cooling gas entering the cooling gas inlet and measuring a second amount of cooling gas exiting from the cooling gas outlet; and determining a difference between the first amount of cooling gas and the second amount of cooling gas.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Embodiments of the present invention detect foreign material (FM) on a semiconductor processing chuck by measuring, with a wafer on the chuck, the amount of coolant gas supplied to the inlet of the chuck and the amount of coolant gas exiting the outlet of the chuck. The difference between these two measurements is used to determine if there is foreign material on the chuck preventing the wafer from sitting flush on the chuck thereby causing coolant gas leakage.

Figure 1:
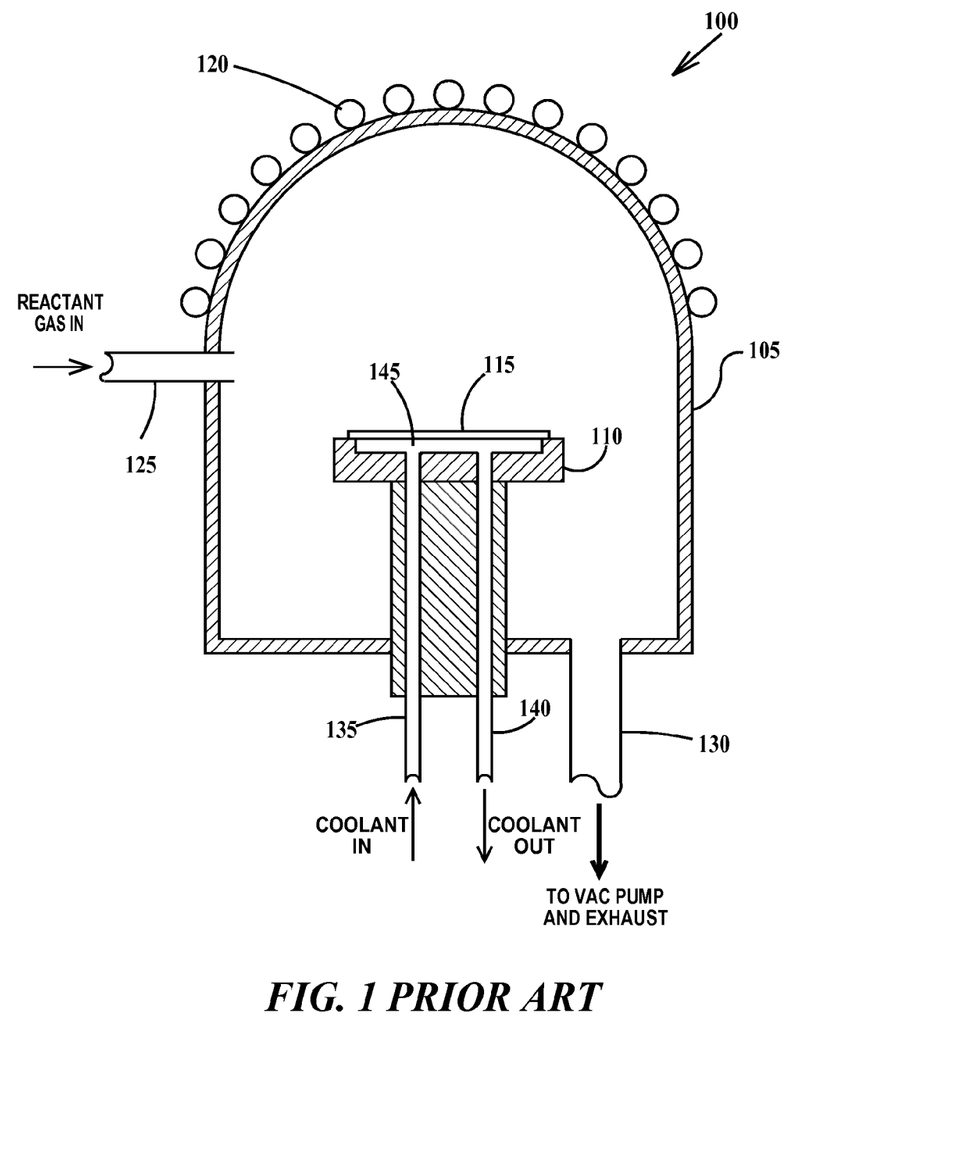
FIG. 1 is a schematic cross-section of an exemplary semiconductor process apparatus to which the present invention may be applied.

FIG. 1 is a schematic cross-section of an exemplary semiconductor process apparatus to which the present invention may be applied. In FIG. 1, a semiconductor process apparatus 100 includes a vacuum chamber 105, a chuck 110 for holding a semiconductor wafer 115, a set of RF coils 120, means 125 for introducing reactant gas into the chamber and a vacuum pump port 130. Chuck 110 includes a coolant fluid in line 135 and a coolant fluid out line 140 and a chamber 145 allowing coolant fluid to contact the backside of wafer 115.

Figures 2A, 2B, 2C:
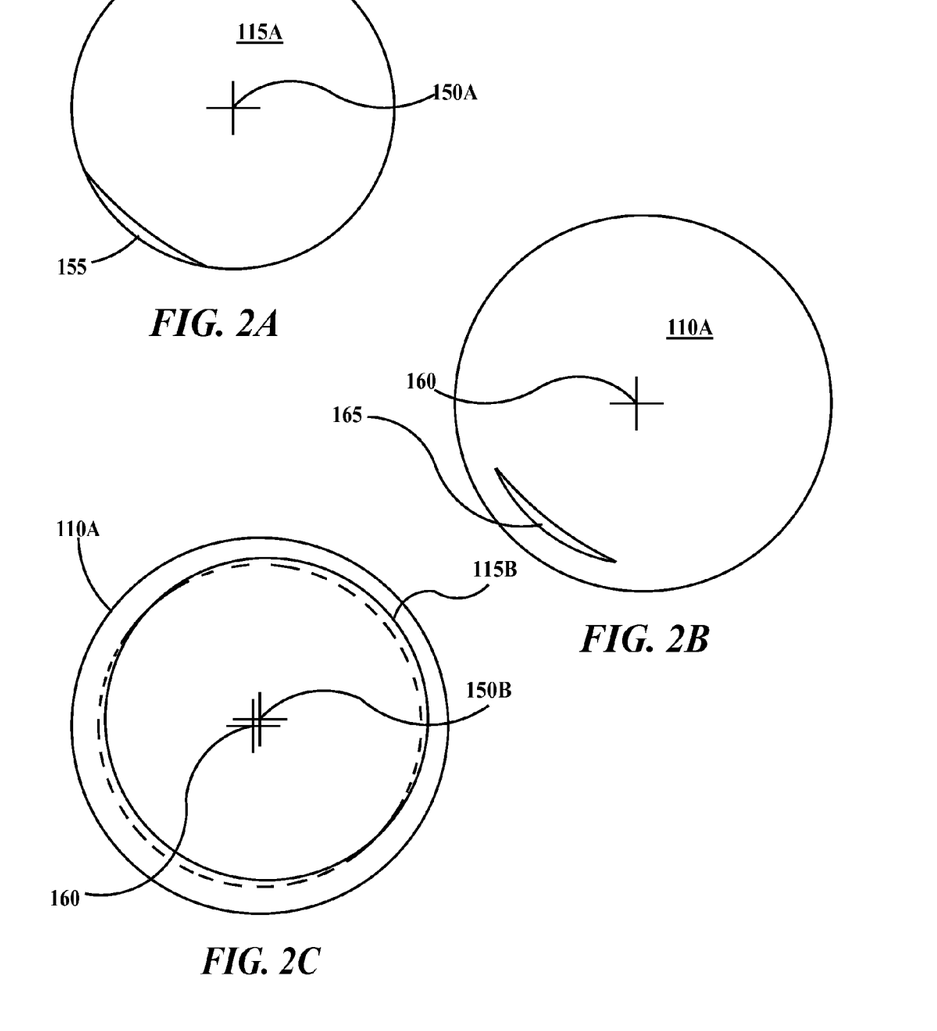
FIGS. 2A, 2B and 2C illustrate a mechanism observed to cause defects on semiconductor wafers.

FIGS. 2A, 2B and 2C illustrate a mechanism observed to cause defects on semiconductor wafers. In FIG. 2A, a semiconductor wafer 115A having a center 150A was processed through a high density plasma (HDP) oxide apparatus and was observed to have a region 155 where the integrated circuit chips were defective due to metal line voiding. In FIG. 2B, the chuck 110A (having a center 160) that was used to process semiconductor wafer 115A was examined and found to have a region 165 where HDP oxide had been deposited. The shape and location of region 165 corresponded to that of region 155 of semiconductor wafer 115A. The cause of the problem was determined to be off-center placement of a previous semiconductor wafer 115B (having a center 150B) on chuck 160 allowing deposition of HDP oxide on the chuck in a position normally protected by the semiconductor wafers as illustrated in FIG. 2C. The deposited HDP oxide prevented the edge of semiconductor wafer 115A from contacting the chuck in region 155 thereby preventing full cooling of the wafer in the region and causing metal line voids.

While the observations were made in an HDP deposition apparatus, the embodiments of the present invention are applicable to apparatus that perform plasma depositions of other dielectric materials in addition to HDP oxide, examples of which plasma enhanced chemical vapor deposition (PECVD) of silicon nitride, silicon-oxy-nitride and deposition of silicon oxide using Tetraethylorthosilicate (TEOS). The invention is also useful in plasma etch and reactive ion etch (RIE) apparatus. The embodiments of the present invention are useful for detecting other sources of foreign material on chucks as well.

While the embodiments of the invention are described using wafers which are circular disks of semiconductor material, a wafer is an example of a substrate to which the embodiments of the present invention may be applied. For example, the embodiments of the present invention may be applied to metallic and ceramic substrates and to substrates that are square or rectangular.

Figure 3A:
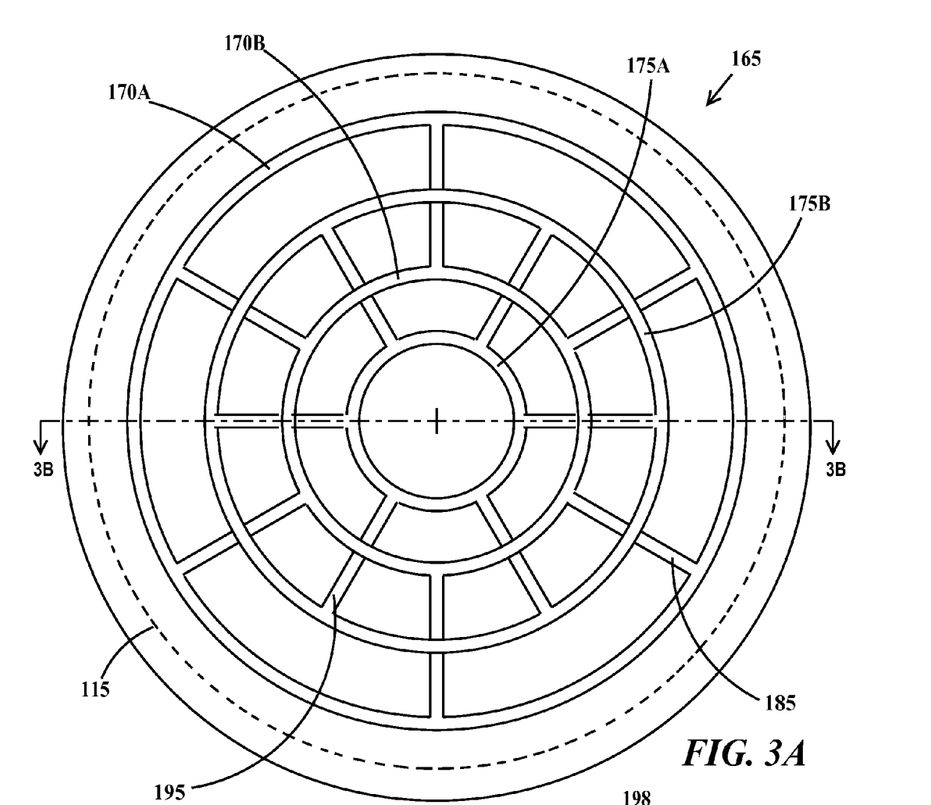
FIG. 3A is a schematic top view and FIG. 3B is a schematic cross-section of a chuck according to an embodiment of the present invention.
Figure 3B:
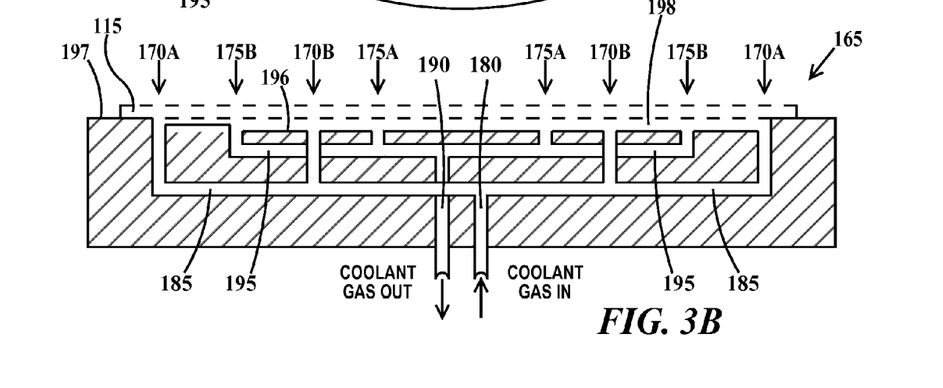

FIG. 3A is a schematic top view and FIG. 3B is a schematic cross-section of a chuck according to an embodiment of the present invention. FIGS. 3A and 3B are intended to show the coolant gas grooves in the top surface of the chuck and inlet and outlet routes to and from the grooves. In FIGS. 3A and 3B, chuck 165 has circular coolant gas inlet grooves 170A and 170B and circular coolant gas outlet grooves 175A and 175B recessed into the top surface of the chuck. Coolant gas inlet grooves 170A and 170B are connected to a coolant gas inlet 180 by galleries 185 in the body of chuck 165. Coolant gas outlet grooves 175A and 1750B are connected to a coolant gas outlet 190 by galleries 195 in the body of chuck 165. From FIG. 3B it is apparent that the entire interior surface 196 of chuck 165 (containing grooves 170A, 170B, 175A and 175B) is recessed below an outer rim 197 of the chuck. This geometry allows the periphery of wafer 115 to be supported while leaving a gap 198 between the backside of the wafer and interior surface 196 allowing direct contact of the coolant gas with the wafer. Other structures, not shown in FIGS. 3A and 3B are contained within chuck 165 and are illustrated in FIG. 5 and described infra.

Figure 4A:
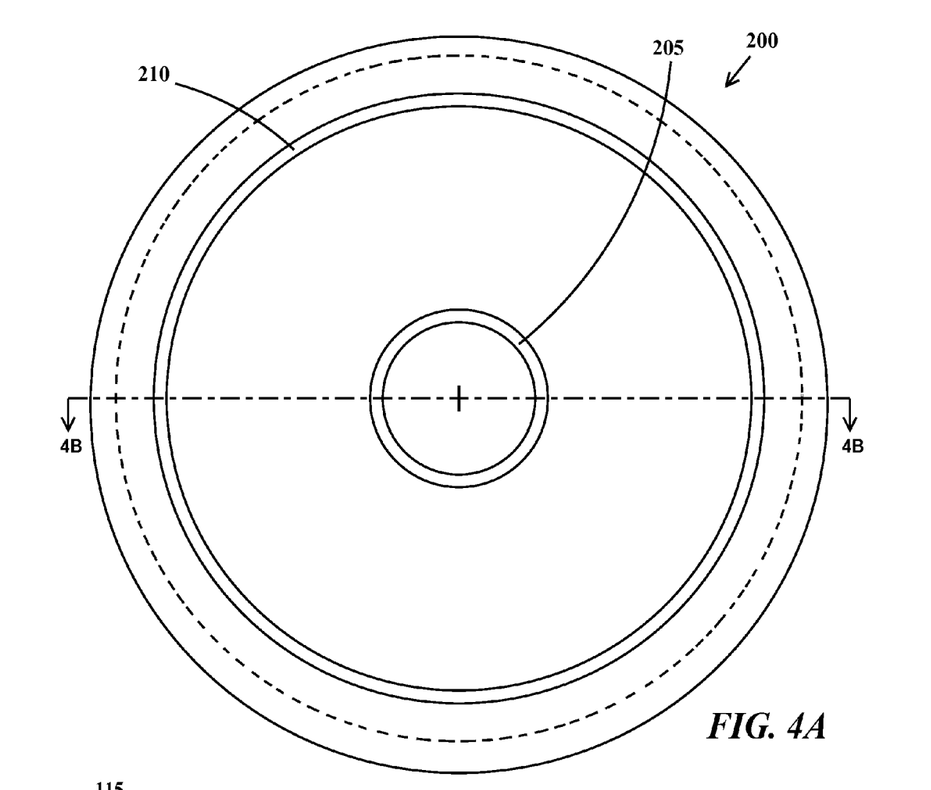
FIG. 4A is a schematic top view and FIG. 4B is a schematic cross-section of a chuck according to an embodiment of the present invention.
Figure 4B:
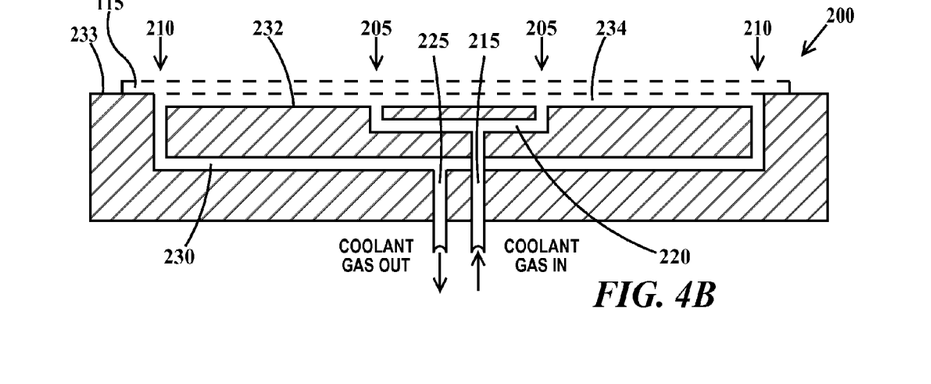

FIG. 4A is a schematic top view and FIG. 4B is a schematic cross-section of a chuck according to an embodiment of the present invention. FIGS. 4A and 4B are intended to show the coolant gas grooves in the top surface of the chuck and inlet and outlet routes to and from the grooves. In FIGS. 4A and 4B, chuck 200 has a circular coolant gas inlet groove 205 and circular coolant gas outlet groove 210 recessed into the top surface of the chuck. Coolant gas inlet groove 205 is connected to a coolant gas inlet 215 by a gallery 220 and coolant gas outlet groove 215 is connected to a coolant gas outlet 225 by a gallery 230. From FIG. 4B it is apparent that the entire interior surface 232 of chuck 200 (containing grooves 205 and 210) is recessed below an outer rim 233 of the chuck. This geometry allows the periphery of wafer 115 to be supported while leaving a gap 234 between the backside of wafer 115 and interior surface 232 allowing direct contact of the coolant gas with the wafer. Other structures, not shown in FIGS. 4A and 4B are contained within chuck 200 and are illustrated in FIG. 5 and described infra.

Figure 5:
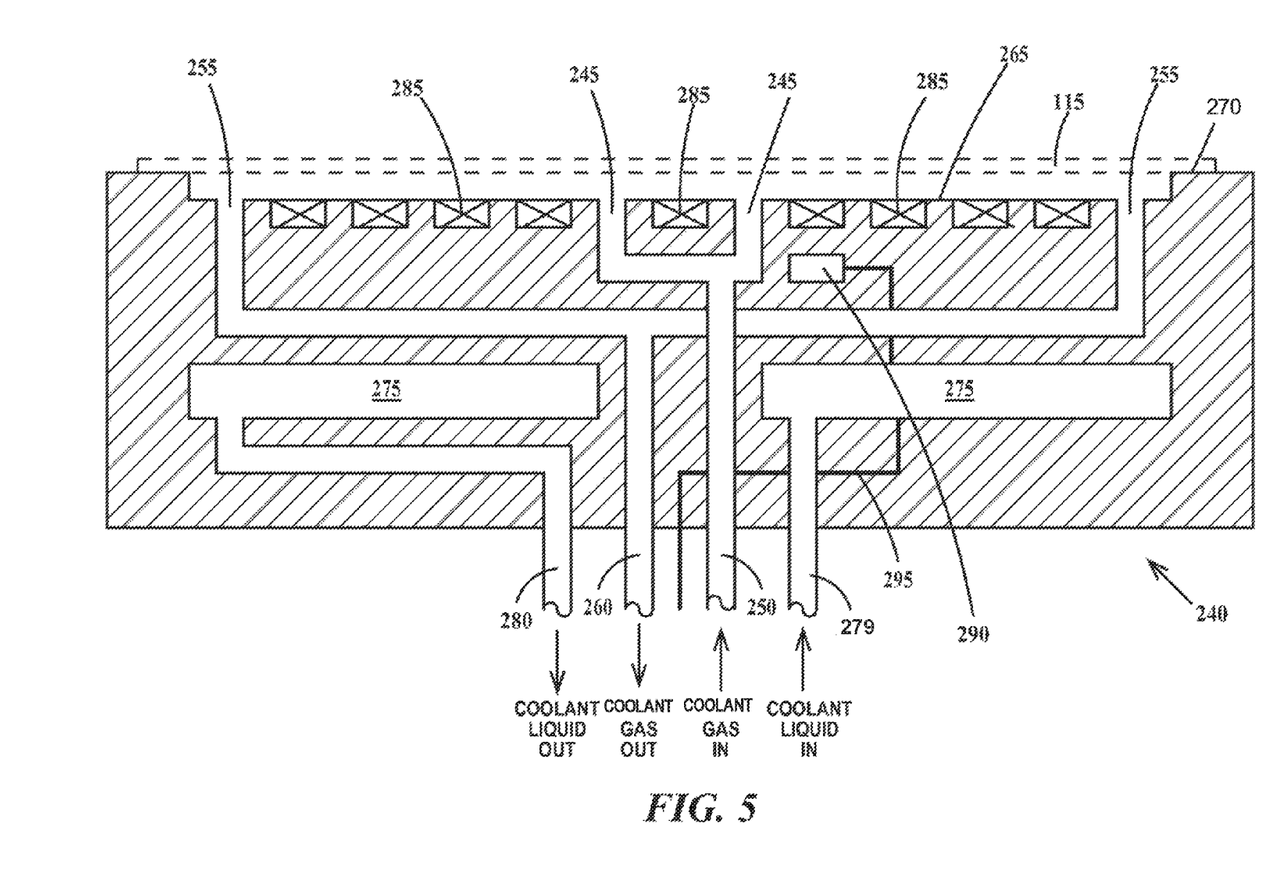
FIG. 5 is a detailed schematic diagram of a chuck according an embodiment of the present invention.

FIG. 5 is a detailed schematic diagram of a chuck according an embodiment of the present invention. FIG. 5 is intended to show the various components of a chuck according to the embodiments of the present invention. In FIG. 5, a chuck 240 includes a coolant inlet groove 245 connected to a coolant gas inlet 250 and a coolant gas outlet groove 255 connected to a coolant gas outlet 260 in a top surface 265 of chuck 240 which is recessed below a top surface 270 of a peripheral region of chuck 240. This allows direct contact between the backside of wafer 115 and the coolant gas which is critical to properly cooling wafer 115 during processing and to the operation of the embodiments of the present invention. The fact that the coolant supplied to grooves 245 and 255 is a gas and not a liquid is also critical to the operation of the embodiments of the present invention. Chuck 240 also includes an optional coolant liquid chamber 275 connected between a coolant liquid inlet 279 and a coolant liquid outlet 280. Chuck 240 is an electrostatic chuck and therefore contains electrodes 285 embedded in (shown) or near top surface 265 of chuck 240. The top surface 265 may include a dielectric layer so an electrostatic attraction force is generated to attract and hold wafer 115 to chuck 240 when a DC voltage is applied to electrodes 285. While an electrostatic chuck is preferred, the embodiments of the present invention may be applied to chucks using a mechanical clamp of the wafer. Chuck 240 also includes a temperature sensor 290 connected to a signal line 295 that may be used to control the flow of coolant gas. Temperature sensor 290 may be embedded in the body of chuck 240 as illustrated or placed in the coolant gas outlet stream.

In one example, the coolant gas comprises nitrogen, helium, neon or argon. In one example, the coolant gas is helium.

Figure 6:
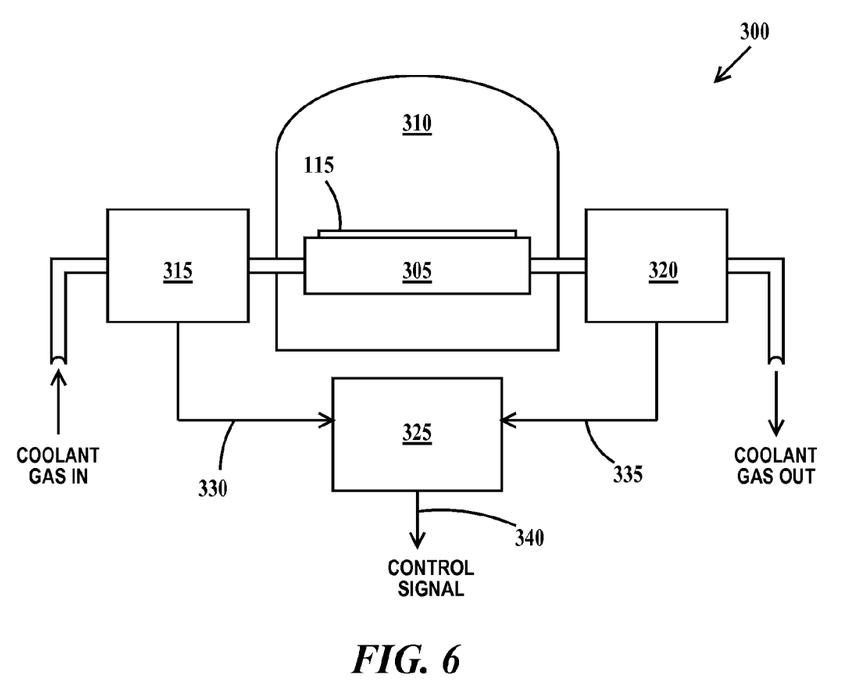
FIG. 6 is a schematic diagram of a semiconductor apparatus according to an embodiment of the present invention.

FIG. 6 is a schematic diagram of a semiconductor apparatus according to an embodiment of the present invention. In FIG. 6, a semiconductor process apparatus 300 includes a chuck 305 (as illustrated in FIGS. 3A, 3B, 4A, 4B and 5 and described supra) in a vacuum process chamber 310 (as illustrated in FIG. 1 and described supra). Semiconductor process apparatus also includes a first mass flow meter 315 connected between a coolant gas inlet and chuck 305, a second mass flow meter 320 connected between chuck 305 and a coolant gas outlet, and a calculation unit 325 that receives a first flow rate signal 330 from first mass flow meter 315 and a second flow rate signal 335 from second flow rate meter 320. Calculation unit 325 generates a control signal 340 based on the values of first flow rate signal 330 and second flow rate signal 335.

Apparatus 300 includes a wafer load/unload system that places wafers on chuck 305 and removes wafer from chuck 305 after processing (e.g., deposition, plasma etch, RIE).

First mass flow meter 315 performs a first measurement of the mass of gas per unit of time going into chuck 305 and second mass flow meter 320 performs a second measurement of the mass of gas per unit of time exiting chuck 305. With a perfect seal between wafer 115 and chuck 305 and no foreign material between wafer 115 and chuck 305 the two measurements should be the same (the values of signals 330 and 340) and the difference between them being zero. However, a perfect seal is not achievable (particularly when the coolant gas is helium) even with no foreign material between wafer 115 and chuck 305 so there will be a loss of coolant gas between first flow meter 315 and second flow meter 320 resulting in a difference between the two measurements even when the chuck is free of foreign material. That is, the second flow meter can be expected to read lower than the first flow meter under nominal conditions. This expected difference is determined experimentally and an acceptable maximum loss (e.g., first measurement minus second measurement) is determined. This acceptable maximum loss becomes a specification limit that is programmed into calculation unit 325. Volumetric flow meters or other means for measuring the amount of coolant gas flow may be substituted for mass flow meters 315 and 320. Apparatus 300 also includes a wafer handling system that loads wafers onto and unloads wafers from the chuck. This system is also responsible for placing the wafer properly aligned (e.g., centered) to the chuck.

In a first example, calculation unit 325 will generate a control signal when the measured loss is greater than the specification (e.g., input meter=8 Torr, output meter=7 Torr, measured loss=1 Torr). This signal may trigger an alarm to alert the operator. In a second example, calculation unit 325 will generate a control signal when the measured loss is greater than the specification. This signal may trigger an alarm to alert the operator and stop the wafer from being processed. Optionally, calculation unit may store the measured loss (which may be zero) by wafer or by time, to be displayed in a trend report that may be used to perform maintenance to clean the chuck or to adjust the placement of wafers on the chuck (see FIG. 2C).

Figure 7:
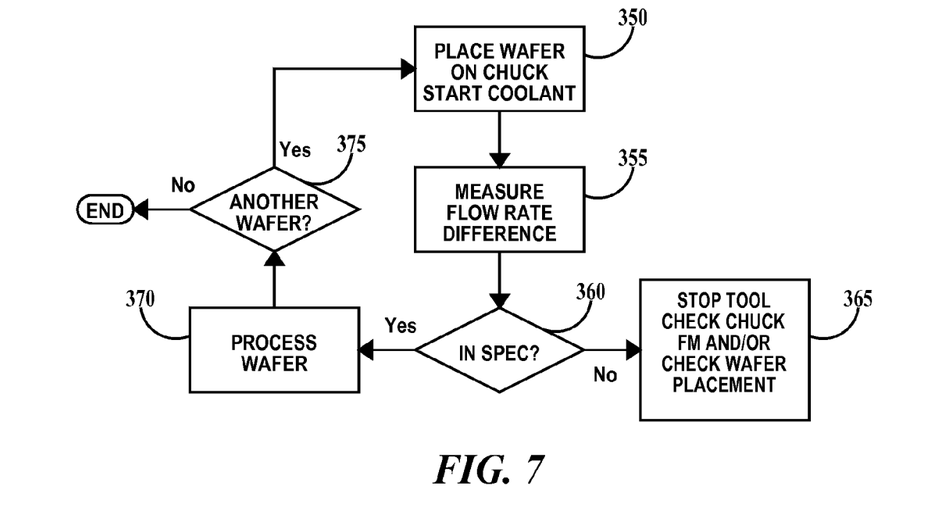
FIG. 7 is a flowchart illustrating a method of using the semiconductor apparatus of FIG. 6.

FIG. 7 is a flowchart illustrating a method of using the semiconductor apparatus of FIG. 6. In step 350, a wafer is placed on a chuck and coolant gas flow is commenced. In step 355, the difference in flow rate between the coolant gas inlet and the coolant gas outlet is measured. In step 360, it is determined if the measured difference (coolant gas flow in minus coolant gas flow out) exceed a specified limit. If the specified limit is exceeded then, in step 365, the apparatus is stopped and the operator notified to check for foreign material on the chuck and/or check the alignment of the wafer load/unload system. It is a key feature of the present invention that the tool performs the flow rate measurements before wafer processing (e.g., before deposition or etching) to prevent a defective wafer from being manufactured.

If in step 360, if the specified limit is not exceeded then in step 370, the wafer is processed (e.g., a deposition is performed) and the wafer is removed from the chuck. Next, in step 375, it is determined if another wafer is to be processed. If another wafer is to be processed then the method loops back to step 350, otherwise the method terminates.

Thus, embodiments of the present invention provide an apparatus and method for detecting foreign material on a semiconductor processing chuck by determining if there is a higher than specified amount of coolant gas lost between the inlet of the chuck and the outlet of the chuck.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a chuck having a top surface and configured to clamp a substrate to said top surface, said chuck having one or more recessed regions in said top surface, said recessed regions configured to allow a cooling gas to contact a backside of said substrate;
a cooling gas inlet and a cooling gas outlet connected to said one or more recessed regions;
a first measurement device connected to said cooling gas inlet and configured to measure a first amount of cooling gas entering said cooling gas inlet;
a second measurement device connected to said cooling gas outlet and configured to measure a second amount of cooling gas exiting from said cooling gas outlet; and
a controller configured to determine a difference between said first amount of cooling gas and said second amount of cooling gas,
wherein said cooling gas comprises helium, neon, argon, or nitrogen.

2. The apparatus of claim 1, wherein said first amount of cooling gas is a first mass of cooling gas and said second amount of cooling gas is a second mass of cooling gas.

3. The apparatus of claim 1, wherein said first measurement device is a first mass flow meter and said second measurement device is a second mass flow meter.

4. The apparatus of claim 1, wherein said chuck is an electrostatic chuck.

5. The apparatus of claim 1, wherein said chuck is configured to clamp a circular semiconductor wafer.

6. The apparatus of claim 1, wherein said controller is configured to generate an alarm when said difference is greater than a specified value.

7. The apparatus of claim 1, further including: a vacuum process chamber, said chuck disposed within said vacuum process chamber, wherein said chuck and vacuum process chamber comprise a high pressure plasma deposition tool or a reactive ion etch tool.

8. The apparatus of claim 7, wherein said controller is configured (i) to prevent deposition of material onto said substrate when said difference is greater than a specified value or (ii) to prevent etching of said substrate when said difference is greater than a specified value.

9. The apparatus of claim 1, further including a substrate handling system configured to load said substrate onto said chuck and remove said substrate from said chuck.

10. A method comprising:
providing a chuck having a top surface and configured to clamp a substrate to said top surface, said chuck having one or more recessed regions in said top surface, said recessed regions configured to allow a cooling gas to contact a backside of said substrate, said chuck including a cooling gas inlet and a cooling gas outlet connected to said one or more recessed regions;
supplying cooling gas to said cooling gas inlet and exhausting said cooling gas from said cooling gas outlet;
measuring a first amount of cooling gas entering said cooling gas inlet;
measuring a second amount of cooling gas exiting from said cooling gas outlet; and
determining a difference between said first amount of cooling gas and said second amount of cooling gas,
wherein said cooling gas comprises helium, neon, argon, or nitrogen.

11. The method of claim 10, wherein said first amount of cooling gas is a first mass of cooling gas and said second amount of cooling gas is a second mass of cooling gas.

12. The method of claim 10, wherein said measuring said first amount of cooling gas is performed using a first mass flow meter and said measuring said second amount of cooling gas is performed using a second mass flow meter.

13. The method of claim 10, wherein said chuck is an electrostatic chuck.

14. The method of claim 10, wherein said chuck is configured to clamp a circular semiconductor wafer.

15. The method of claim 10, wherein said controller generates an alarm when said difference is greater than a specified value.

16. The method of claim 10, further including: disposing said chuck in a vacuum process chamber, wherein said chuck and vacuum process chamber comprise a high pressure plasma deposition tool or a reactive ion etch tool.

17. The method of claim 16, wherein said controller generates a signal (i) to prevent deposition of material onto said substrate when said difference is greater than a specified value or (ii) to prevent etching of said substrate when said difference is greater than a specified value.

18. The method of claim 10, further including providing a substrate handling system to load said substrate onto said chuck and remove said substrate from said chuck.

* * * * *